(12) United States Patent
Sone

(10) Patent No.: US 6,608,369 B2
(45) Date of Patent: Aug. 19, 2003

(54) LEAD FRAME, SEMICONDUCTOR DEVICE AND MANUFACTURING METHOD THEREOF, CIRCUIT BOARD AND ELECTRONIC EQUIPMENT

(75) Inventor: Masaaki Sone, Sakata (JP)

(73) Assignee: Seiko Epson Corporation, Toyko (JP)

(*) Notice: Subject to any disclaimer, the term of this patent is extended or adjusted under 35 U.S.C. 154(b) by 0 days.

(21) Appl. No.: 09/859,454

(22) Filed: May 18, 2001

(65) Prior Publication Data

US 2002/0017706 A1 Feb. 14, 2002

(30) Foreign Application Priority Data

Jun. 1, 2000  (JP) .................................... 2000-164674

(51) Int. Cl.[7] .............................................. H01L 21/44
(52) U.S. Cl. ................... 257/676; 257/673; 257/692; 257/666; 257/678; 257/674; 438/127; 438/123
(58) Field of Search ................... 257/673, 692, 257/737, 666, 676, 678, 787, 706, 707, 796, 674, 670, 675, 684, 693, 730, 717, 710, 712, 713; 438/106, 118, 123, 127

(56) References Cited

U.S. PATENT DOCUMENTS

| 5,252,783 | A | | 10/1993 | Baird |
| 5,648,682 | A | * | 7/1997 | Nakazawa et al. .......... 257/763 |
| 5,777,380 | A | * | 7/1998 | Otsuki et al. ............... 257/675 |
| 6,081,029 | A | * | 6/2000 | Yamaguchi .................. 257/718 |
| 6,081,978 | A | * | 7/2000 | Utsumi et al. .............. 29/25.01 |
| 6,166,430 | A | * | 12/2000 | Yamaguichi ................. 257/666 |
| 6,208,023 | B1 | * | 3/2001 | Nakayama et al. ......... 257/696 |
| 2002/0031869 | A1 | * | 3/2002 | Minamio et al. ........... 438/127 |

FOREIGN PATENT DOCUMENTS

| JP | 4-114455 A | 4/1992 |
| JP | 6-77358 A | 3/1994 |
| JP | 8-213536 A | 8/1996 |
| JP | 9-64243 A | 3/1997 |
| JP | 9-92757 A | 4/1997 |
| TW | 385509 | 3/2000 |

* cited by examiner

*Primary Examiner*—Nathan J. Flynn
*Assistant Examiner*—Fazli Erdem
(74) *Attorney, Agent, or Firm*—Oliff & Berridge, PLC.

(57) ABSTRACT

The invention provides a highly reliable lead frame, in spite of its structure, in which a bottom surface of a die pad thereof is exposed. The invention also provides a semiconductor device, a method for manufacturing the semiconductor device, a circuit board and electronic equipment. The semiconductor device includes a semiconductor chip, a die pad having an end section formed with a thin portion that is thinner than a central section thereof, and a sealing material. One surface of the thin portion of the die pad is coplanar with one surface of the central section. The sealing material leaves the surfaces of the thin portion and the central section that are coplanar exposed, and seals the end section of the die pad.

9 Claims, 6 Drawing Sheets

LEAD FRAME, SEMICONDUCTOR DEVICE AND MANUFACTURING METHOD THEREOF, CIRCUIT BOARD AND ELECTRONIC EQUIPMENT

FIELD OF THE INVENTION

The present invention relates to lead frames, semiconductor devices and a manufacturing method therefor, circuit boards and electronic equipment.

DESCRIPTION OF THE RELATED ART

A package having a bottom surface of a die pad of a lead frame exposed is known. In manufacturing this type of package, a molding process is conducted to mold resin while pressing the die pad against a molding die. However, the resin enters between the die pad and the molding die such that burrs are formed in the bottom surface of the die pad. Also, in this type of package, the die pad and the resin are likely to be delaminated from each other at their interface.

The present invention has been made to solve the problems described above. It is an object of the present invention to provide a highly reliable lead frame in spite of its structure in which the bottom rear surface of a die pad is exposed, a semiconductor device and a method for manufacturing the same, a circuit board and electronic equipment.

SUMMARY OF THE INVENTION (1) A lead frame according to the present invention is a lead frame having an outer frame and a die pad, the die pad having an end section formed with a thin portion thinner than a central section thereof, one surface of the thin portion being formed in the same plane ash one surface of the central section, and the die pad being shifted from the outer frame in a direction in which the surfaces of the thin portion and the central section formed in the same plane face.

According to the present invention, because the thin portion is formed at an end section of the die pad, a sealing material can be readily placed thereon. Accordingly, the die pad can be readily pressed against a mold in the molding step. Furthermore, the sealing material does not enter between the die pad and the mold, and therefore it is unlikely that burrs will be be formed. Also, by forming a thin portion at an end section of the die pad, the distance from one surface of the die pad to the other surface thereof becomes longer even when one surface of the die pad is exposed and sealed with a sealing material. Therefore, even when the die pad and the sealing material are delaminated from one another at their interface, penetration of water can be reduced.

(2) In the lead frame, the die pad is connected to the outer frame by hanger pins, the thin portion is formed at the end section of the die pad avoiding a portion thereof, the hanger pins may be connected to the portion of the die pad in which the thin portion has not been formed.

As a result, since the hanger pin is connected to the die pad while avoiding the thin portion thereof, reduction in strength at the connecting section between the two can be prevented.

(3) In the lead frame, the die pad has a step formed at the end section to thereby form the thin portion, wherein of surfaces that form the step an end surface that rises in a direction of thickness of the die pad may be formed with a recessed surface.

Accordingly, a sealing material can be provided so that it enters into the recessed surface, whereby the adhesion between the recessed surface and the sealing material is improved.

(4) A semiconductor device according to the present invention comprises a semiconductor chip, a die pad on which the semiconductor chip is mounted, the die pad having an end section formed with a thin portion thinner than a central section thereof, and a sealing material that seals the semiconductor chip, wherein one surface of the thin portion of the die pad is formed in the same plane as one surface of the central section, and the sealing material leaves exposed the surfaces of the thin portion and the central section in the coplanar surface of the die pad, and seals the end section of the die pad.

According to the present invention, since the thin portion is formed at the end section of the die pad, the distance from one surface of the die pad to the other surface thereof becomes longer, penetration of water can be reduced even when the die pad and the sealing material are delaminated from one another at their interface. Also, because the thin portion is formed at the end section of the die pad, the sealing material can be readily placed thereon. Accordingly, the die pad can be readily pressed against a mold in the molding step, the sealing material will not enter between the die pad and the mold, and therefore it is unlikely that burrs will be formed.

(5) In the semiconductor device, the die pad has a step formed at the end section to thereby form the thin portion, wherein of surfaces that forms the step an end surface that rises in a direction of thickness of the die pad may be formed with a recessed surface.

Accordingly, a sealing material can enter into the recessed surface, whereby the adhesion between the recessed surface and the sealing material is improved.

(6) In the semiconductor device, a brazing material may be provided on the surface of the die pad that the sealing material has left exposed.

As a result, the exposed surface on the die pad can be protected by the brazing material, and the brazing material can be used to facilitate bonding between the die pad and other members.

(7) A circuit board according to the present invention comprises the semiconductor device.

(8) A circuit board according to the present invention comprises the semiconductor device, and is provided with a heat dissipating member that is bonded to the die pad by the brazing material.

As a result, heat that is generated in the semiconductor chip can be dissipated through the heat dissipating member bonded to the die pad.

(9) Electronic equipment according to the present invention comprises the semiconductor device.

(10) Electronic equipment according to the present invention comprises the semiconductor device, and is provided with a heat dissipating member that is bonded to the die pad by the brazing material.

As a result, heat that is generated in the semiconductor chip can be dissipated through the heat dissipating member bonded to the die pad.

(11) A method for manufacturing a semiconductor device according to the present invention includes a molding step that is conducted by setting on a mold a lead frame having a semiconductor chip mounted on a die pad, wherein the die pad has an end section formed with a thin portion thinner than a central section thereof, one surface of the thin portion is formed in the same plane as one surface of the central section, and a sealing material is placed on the thin portion to thereby bring the die pad into contact with the inner surface of the mold, whereby the molding step is conducted.

According to the present invention, because the thin portion is formed at an end section of the die pad, a sealing material can be readily placed thereon, and therefore the die pad on which the sealing material is placed can be pressed against the mold. Accordingly, the molding step can be conducted without allowing the sealing material to enter between the die pad and the mold. In this manner, a semiconductor device can be manufactured so that burrs will not formed on the die pad.

(12) The method for manufacturing a semiconductor device includes an electrolytic plating step to be conducted for the lead frame after the molding step, wherein the lead frame has an outer frame and a hanger pin that connects the outer frame to the die pad, and wherein the electrolytic plating step may be conducted before the hanger pin is cut.

Accordingly, the hanger pin can be used to maintain electrical connection between the outer frame and the die pad to conduct an electrolytic plating.

(13) In the method for manufacturing a semiconductor device, the lead frame includes a plurality of leads that are connected to one another by a dam bar, wherein the electrolytic plating step may be conducted after the dam bar is cut.

As a result, cut surfaces at the dam bar in the leads can also be electrolytically plated.

DESCRIPTION OF THE PREFERRED EMBODIMENTS

Preferred embodiments of the present invention are described with reference to the accompanying drawings.

(Lead Frame)

Figure 1:
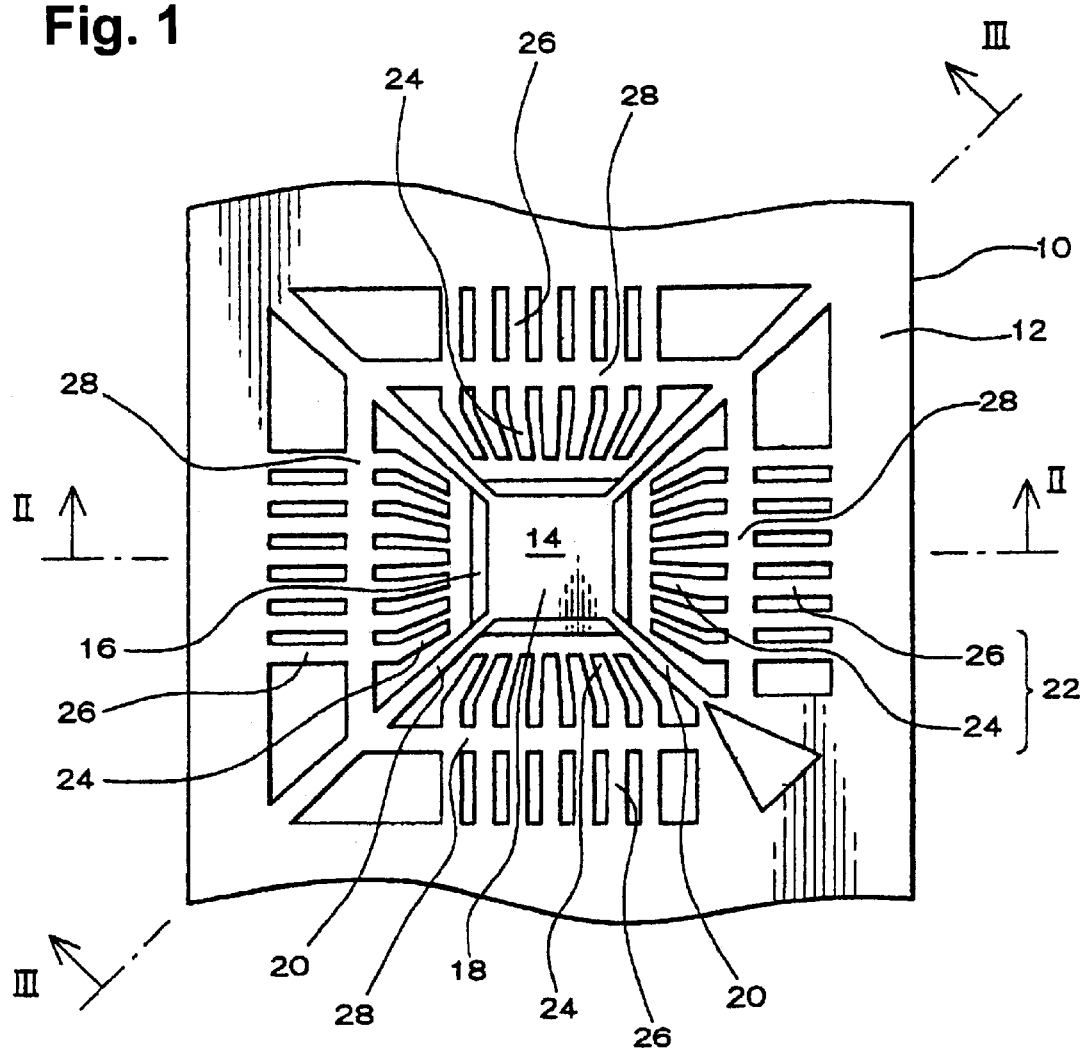
FIG. 1 shows a lead frame according to one embodiment of the present invention.
Figure 2:
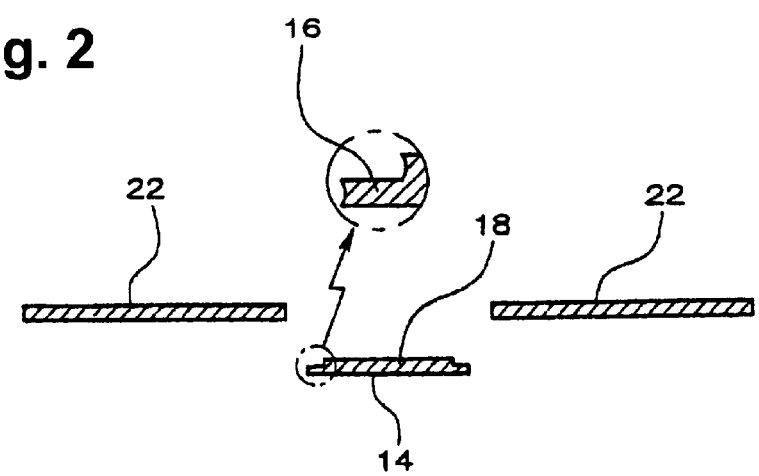
FIG. 2 shows a cross-sectional view taken along lines II—II of FIG. 1.
Figure 3:
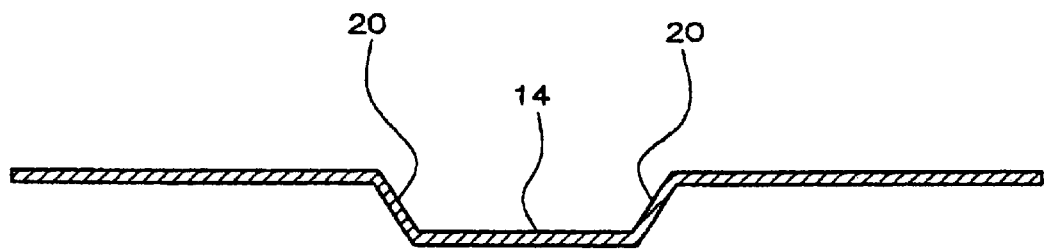
FIG. 3 shows a cross-sectional view taken along lines III—III of FIG. 1.

FIG. 1 shows a lead frame according to one embodiment of the present invention. FIG. 2 shows a cross-sectional view taken along lines II—II of FIG. 1. FIG. 3 shows a cross-sectional view taken along lines III—III of FIG. 1.

A lead frame 10 is formed by treating a plate of copper or iron material. The treatment method includes chemical etching, mechanical punching or the like. The lead frame 10 includes an outer frame 12. The outer frame 12 is rectangular in many occasions, the shape of the outer frame 12 defines an external shape of the lead frame 10. The outer frame 12 may preferably be provided with jig holes (not shown) for insertion of guide pins provided on a mold for molding. As a result, positioning of the lead frame 10 with respect to the mold can be readily conducted.

The lead frame 10 has a die pad 14. The die pad 14 is a portion where an electronic part such as a semiconductor chip 30 (see FIG. 4) is mounted, and is rectangular (in particular, square) in many cases. According to the present embodiment, the die pad 14 has a thin portion 16 at an end section thereof as shown in FIG. 2. The thin portion 16 can be formed by half-etching. Also, when the plate material is worked into a configuration of the lead frame 10, half-etching may be conducted at the same time to form the thin portion 16.

The thin portion 16 is thinner than a central section 18 of the die pad 14. By forming the thin portion 16, at least one step is formed at an end section of the die pad 14 (although only one step is shown in the example of FIG. 2, a plurality of steps may be formed).

Of surfaces that connect one surface of the die pad 14 to the other thereof (for example, surfaces that compose the step formed at the end section of the die pad 14), surfaces that extend in a direction of the thickness of the die pad 14 may preferably have concave surfaces, as shown in an enlarged view in FIG. 2. Due to the configuration, a sealing material would readily enter into the concave sections of the surfaces, and therefore the end section of the die pad 14 and the sealing material 42 (see FIG. 4) can readily come in close contact with each other.

One surface of the thin portion 16 is coplanar with one surface of the central section 18 of the die pad 14. In other words, the end section of the die pad 14 is thinned from only one surface side to form the thin portion 16. One surface (bottom surface) of the die pad 14 is formed so that the surfaces of the thin portion 16 and the central section 18 are coplanar.

Figure 4:
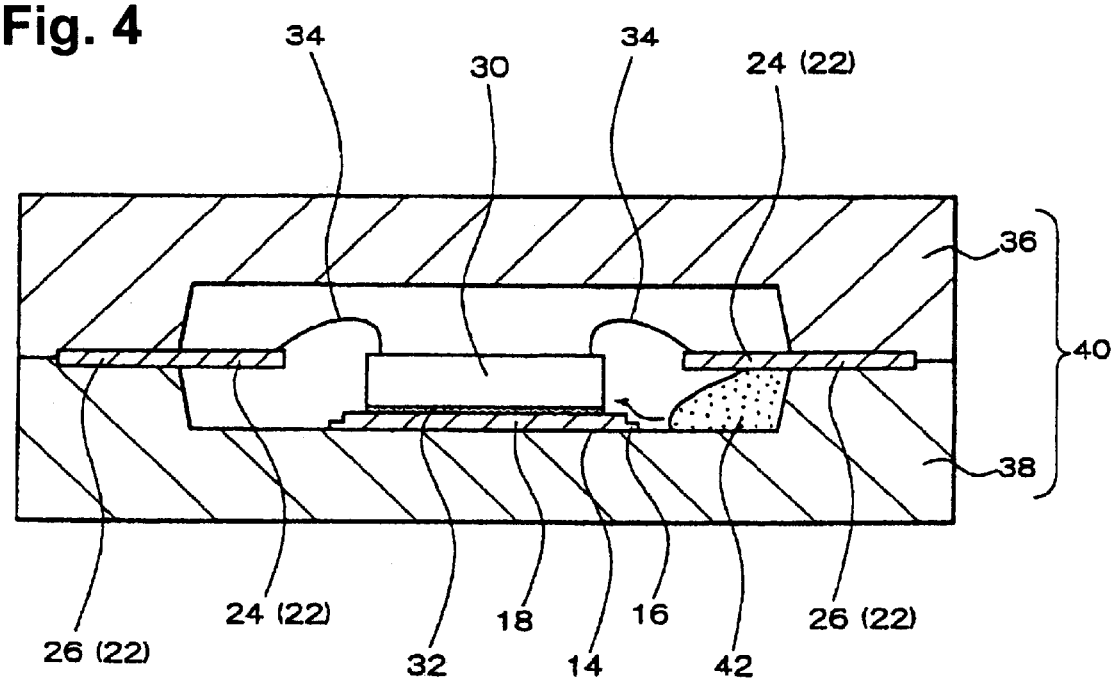
FIG. 4 is an illustration that describes a method for manufacturing a semiconductor device according to one embodiment of the present invention.

The other surface (front surface) of the die pad 14 is formed by a surface of the central section 18, a surface of the thin portion 16 and a surface that connects these surfaces (for example, surface that rises in the direction of the thickness of the die pad 14 shown in FIG. 2). The surface of the central section 18 that is not coplanar with the surface of the thin portion 16 is a mounting surface on which a semiconductor chip 30 is mounted, as shown in FIG. 4, and has a larger area than the semiconductor chip 30.

One surface of the die pad 14 (the surface where the surface of the central section 18 and the surface of the thin portion 16 are coplanar) is larger than a surface of the central section 18 from among the other surfaces of the die pad 14. The one surface of the die pad 14 may preferably be flat in its entirety. As a result, the entire one surface of the die pad 14 can be put into contact with the internal surface of a mold 40 (see FIG. 4) during the molding process.

The thin portion 16 may be formed entirely along the end section of the die pad 14, except, however, for one portion as shown in FIG. 1. In the example shown in FIG. 1, the thin portion 16 is formed except for corner sections of the rectangular die pad 14. The corner sections of the die pad 14 have the same thickness as that of the central section 18.

The die pad 14 is connected to the outer frame 12 by hanger pins (tie bars or hanger leads) 20. The hanger pins 20 may preferably be connected to the die pad 14 bypassing the thin portion 16. As a result, the strength of connection portions between the die pad 14 and the hanger pins 20 can be prevented from deteriorating. For example, as shown in FIG. 1, the corner sections of the die pad 14 may be formed thicker than the thin portion 16 (or may have generally the same thickness as that of the central section 18), such that the corner sections form the connection portions with the hanger pins 20.

The hanger pins 20 are bent as shown in FIG. 3 such that the thin portion 16 of the die pad 14 shifts from the outer frame 12. More specifically, the die pad 14 is shifted from the outer frame 12 in a direction that the coplanar surface of the thin portion 16 and the central section 18 face. Also, the die pad 14 is down-set. In other words, the surface of the die pad 14 that is opposite to the direction in which the die pad 14 is shifted from the outer frame 12 defines a mounting surface for mounting the semiconductor chip 30. Alternatively, the opposite surface of the coplanar surface of the thin portion 16 and the central section 18 in the die pad 14 defines a mounting surface for the semiconductor chip 30. Alternatively, one surface that is cut to form the thin portion 16 in the die pad 14 defines a mounting surface for the semiconductor chip 30. It is noted that, in the present embodiment, as shown in FIG. 4, the die pad 14 is positioned such that the leads 22 are positioned higher than the pads (not shown) of the semiconductor chip 30.

The lead frame 10 has a plurality of leads 22. The leads 22 are provided in a manner to extend from the outer frame 12 to the die pad 14. More particularly, the leads 22 include inner leads 24 and outer leads 26. The inner leads 24 are portions that are sealed by a sealing material 42 in a semiconductor device (see FIG. 8), and the outer leads 26 are portions that lead out the sealing material 42 and are used for electrical connection with external parts.

The outer leads 26 extend from the outer frame 12 at a right angle with respect to each of the edges of the rectangular die pad 14. The inner leads 24 extend from the outer leads 26 at angles toward the central section of the die pad 14. Adjacent ones of the leads 22 are connected to one anther with dam bars 28. More particularly, the dam bars 28 connect the adjacent ones of the outer leads 26 at sections closer to the inner leads 24.

The lead frame 10 according to the present embodiment employs other known lead frame components in addition to the components described above.

(Method for Manufacturing Semiconductor Device)

FIGS. 4 through 7 are illustrations that describe a method for manufacturing a semiconductor device according to one embodiment of the present invention.

First, the lead frame 10 described above is prepared, and a semiconductor chip 30 is affixed to the die pad 14 (a die bonding step). For example, the die pad 14 and the semiconductor chip 30 are bonded together by an adhesive 32. A thermosetting resin can be used as the adhesive 32. However, a material having a high thermal conductivity, for example metal paste (silver paste or the like) can also be used. It is noted that, the hanger pins 20 may be bent before the die-bonding step as shown in FIG. 3, or the hanger pins 20 can be bent after the die-bonding step.

Next, a wire-bonding step is conducted. For example, pads (not shown) of the semiconductor chip 30 and the inner leads 24 are bonded to wires 34. In this step, a known wire bonder can be used. However, according to the present embodiment, since the inner leads 24 are positioned higher than the pads of the semiconductor chip 30, the loop height of the wires 34 may be adjusted accordingly.

Then, a molding step is conducted. More particularly, as shown in FIG. 4, the lead frame 10 on which the semiconductor chip 30 is mounted is set on a mold for molding (for example, a metal mold) 40. The mold 40 includes an upper mold 36 and a lower mold 38.

The lead frame 10 is set so that the die pad 14 comes into contact with the inner surface of the lower mold 38. Then, the semiconductor chip 30, the wires 34 and the inner leads 24 are sealed by a sealing material (molding resin) 42. A thermosetting resin is frequently used as the sealing material 42.

In the present embodiment, the thin portion 16 is formed at the end section of the die pad 14. The surface on the side where the thin portion 16 and the central section 18 are coplanar with one another comes into contact with the lower mold 38, and the side which is thinly cut is sealed by the sealing material 42. Therefore, the sealing material 42 is readily deposited on the thin portion 16, whereby it is unlikely that the sealing material 42 will enter between the die pad 14 and the lower mold 38. As a result, burrs are unlikely to form on the die pad 14.

Figure 5:
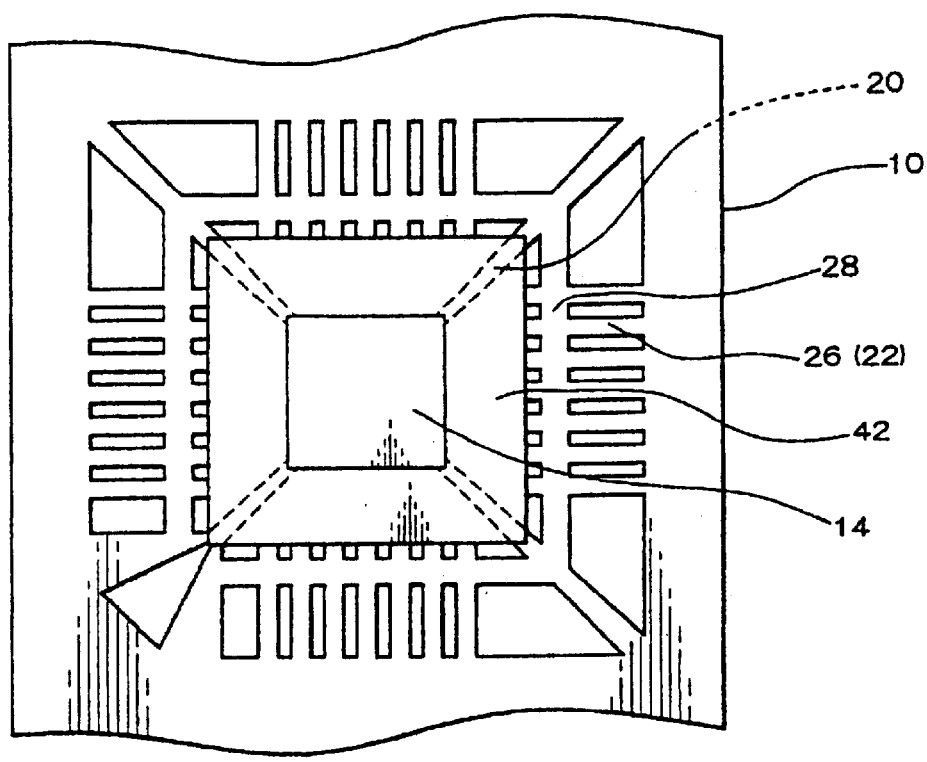
FIG. 5 is an illustration that describes a method for manufacturing a semiconductor device according to one embodiment of the present invention.

FIG. 5 shows the lead frame 10, which is removed from the mold 40 after the sealing material 42 is hardened. It is noted that the lead frame 10 shown in FIG. 5 is in a state viewed from the rear side of the lead frame 10 shown in FIG. 1. As shown in FIG. 5, one surface of the die pad 14 is exposed through the sealing material 42. In this state, if burrs are created on the surface of the leads 22, a bur-removing step will be conducted.

Figure 6:
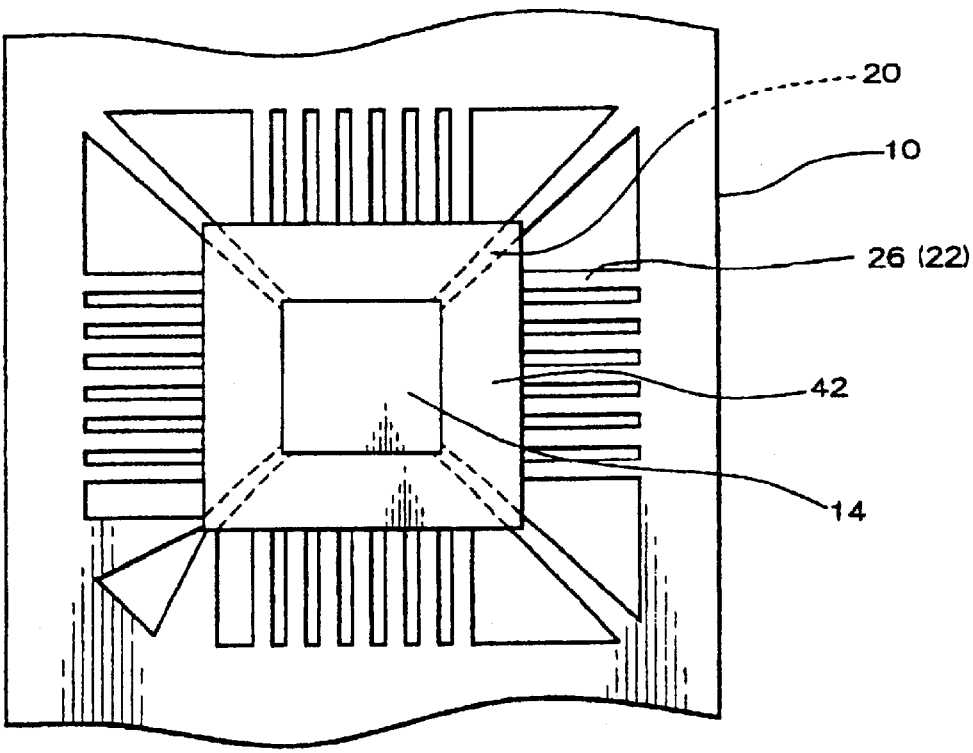
FIG. 6 is an illustration that describes a method for manufacturing a semiconductor device according to one embodiment of the present invention.

Next, as shown in FIG. 6, a first trimming step is conducted. In other words, the dam bars 28 connecting the leads 22 are cut. By cutting the dam bars 28, cut faces of the dam bars 28 can also be plated in the succeeding electrolytic plating process. In the present embodiment, at this point, the hanger pins 20 are not cut.

Then, an electrolytic plating step is conducted. Namely, a metal coat film formed from a brazing material (for example, solder), tin or the like is formed on portions that are exposed through the sealing material 42 on the lead frame 10. For example, since the plural outer leads 26 are connected to the outer frame 12, and electrically connectable through the outer frame 12, they can be electrolytically plated. Also, the die pad 14 is connected to the outer frame 12 through the hanger pins 20 and electrically connectable through the hanger pins 20, they can be electrolytically plated. In this manner, the metal coat film is formed, which improves the corrosion resistance. Also, by plating a brazing material such as solder, connection between the outer leads 26 and wiring patterns, and connection between the die pad 14 and the heat dissipating member 54 (see FIG. 8) can be readily conducted.

Figure 7:
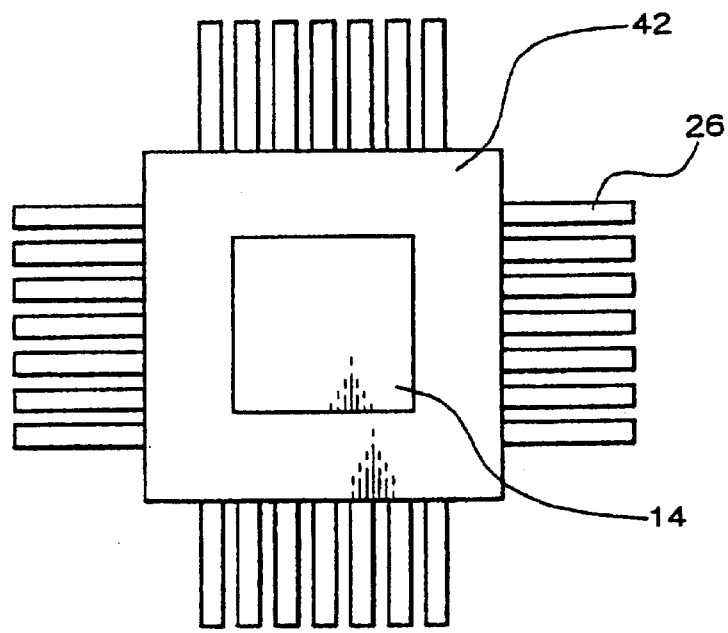
FIG. 7 is an illustration that describes a method for manufacturing a semiconductor device according to one embodiment of the present invention.

Next, as shown in FIG. 7, a second trimming step is conducted. More specifically, the outer leads 26 are cut from the outer frame 12, and the hanger pins 20 are removed. Then, a forming step is conducted. More specifically, the outer leads 26 are bent into a shape that can be readily mounted on the circuit board. The second trimming step and the forming step can be simultaneously conducted.

If necessary, a marking step is conducted, and an inspection step is conducted. The steps described above are conducted to manufacture a semiconductor device.

(Semiconductor Device, Circuit Board)

Figure 8:
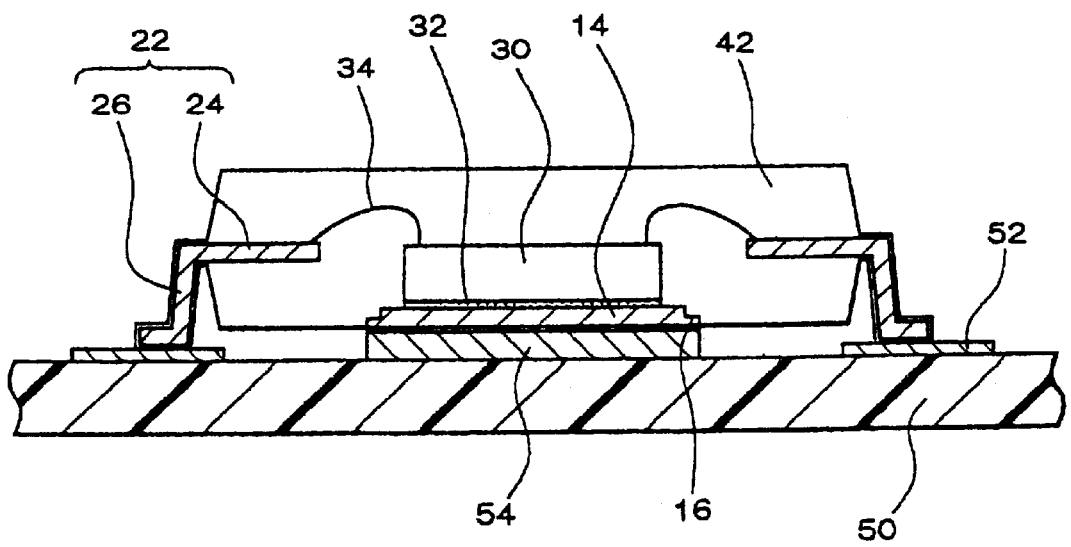
FIG. 8 is an illustration of a circuit board on which a semiconductor device according to one embodiment of the present invention is mounted.

FIG. 8 shows a semiconductor device according to one embodiment of the present invention. The semiconductor device according to the present embodiment has a semiconductor chip 30, a die pad 14 and a sealing material 42. One surface of the die pad 14 is left exposed by the sealing material 42.

In the present embodiment, a step is formed by providing a thin portion 16 at an end section of the die pad 14. As a result, the distance from the exposed surface in the sealing material 42 to the semiconductor chip 30 becomes longer. Therefore, water is less likely to penetrate from the outside, and its crack-resistance is improved.

Also, the surfaces that rises in the direction of the thickness of the die pad 14 are concave as shown in an enlarged view in FIG. 2. As a result, the sealing material enters into the concave surface such that the end section of the die pad 14 and the sealing material 42 (see FIG. 4) are brought into close contact with each other. Accordingly, even when the sealing material 42 shrinks and deforms, gaps are unlikely to form at the interface between the die pad 14 and the sealing material 42, and therefore cracks are unlikely to be created.

Referring to FIG. 8, the semiconductor device is mounted on a circuit board 50. The circuit board 50 is generally formed using an organic material substrate, such as a glass epoxy substrate or the like. A wiring pattern 52 composed of, for example, copper or the like is formed on the circuit substrate 50 so as to provide a designed circuit, and the wiring pattern 52 is connected to the outer leads 26 of the semiconductor device. Also, a heat-dissipating member (heat spreader) 54 is provided on the circuit board 50. The heat-dissipating member 54 is bonded to an exposed surface of the die pad 14 of the semiconductor device. As a result, heat generated in the semiconductor chip 30 can be dissipated from the heat-dissipating member 54 through the die pad 14. The semiconductor device according to the present embodiment and other components are formed in a manner described above with respect to the lead frame 10 and the method for manufacturing semiconductor devices.

Figure 9:
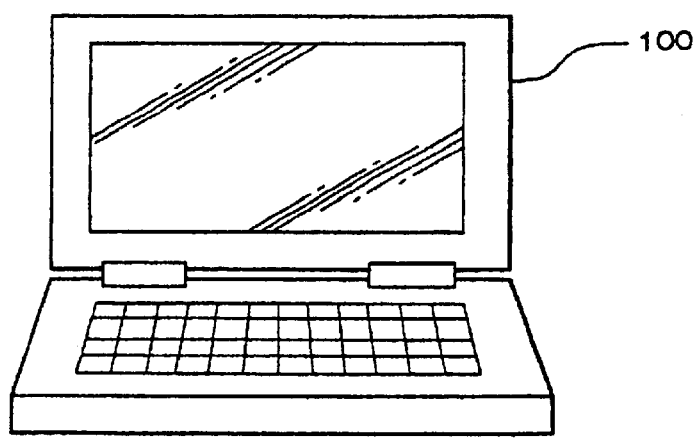
FIG. 9 is an illustration of electronic equipment having a semiconductor device according to one embodiment of the present invention.
Figure 10:
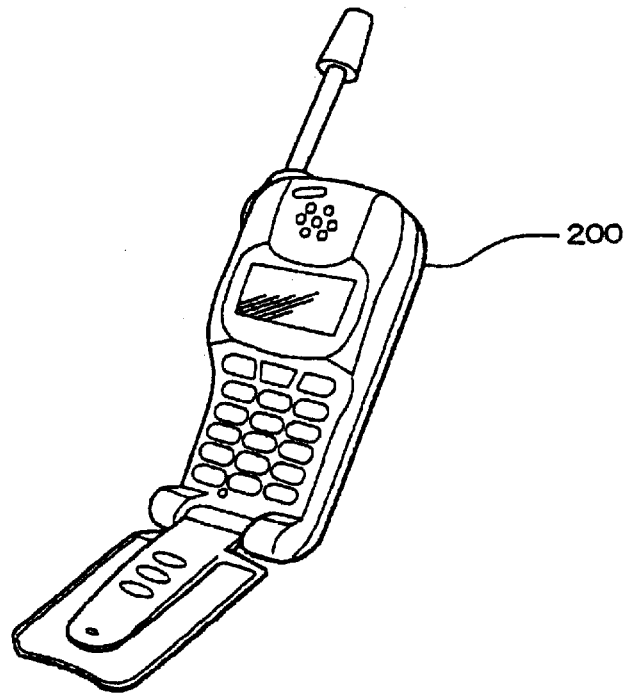
FIG. 10 is an illustration of electronic equipment having a semiconductor device according to one embodiment of the present invention.

Furthermore, as electronic equipment in which the present invention is applied, FIG. 9 shows a notebook-type personal computer 100, and FIG. 10 shows a hand-carry type telephone 200.

Figure 11:
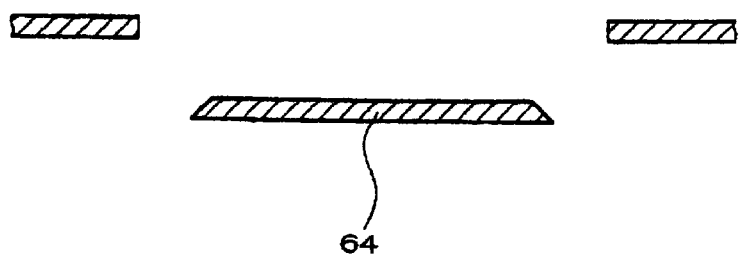
FIG. 11 is an illustration of a modified example of one embodiment of the present invention.
Figure 12:
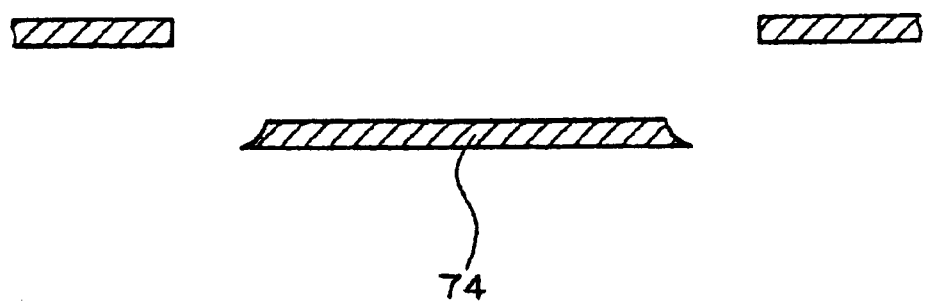
FIG. 12 is an illustration of a modified example of one embodiment of the present invention.

The present invention is not limited to the embodiments described above, and many modifications can be made. For example, as shown in FIG. 11, end surfaces of a die pad 64 may be provided with sloped surfaces to form thin portions. Alternatively, as shown in FIG. 12, end surfaces of a die pad 74 may be provided with concave surfaces to form thin portions.

What is claimed is:

1. A lead frame, comprising:
   an outer frame;
   a die pad, the die pad having an end section defining a thin portion, the die pad also having a central portion, the thin portion being thinner than the central portion, one surface of the thin portion being coplanar with one surface of the central portion, the die pad being shifted from the outer frame in a direction that is perpendicular to the coplanar surfaces of the thin portion and the central portion; and
   a hanger pin, the die pad being connected to the outer frame by the hanger pin, the end section of the die pad also defining a raised portion that is thicker than the thin portion, the hanger pin being connected to the raised portion of the die pad.

2. The lead frame according to claim 1, the thin portion and the central portion defining a step, the step having a vertical surface that extends in a direction that intersects the coplanar surfaces, the vertical surface defining a recessed portion.

3. A semiconductor device, comprising:
   a semiconductor chip;
   a die pad on which the semiconductor chip is mounted, the die pad having an end section defining a thin portion, the die pad also having a central portion, the thin portion being thinner than the central portion, one surface of the thin portion of the die pad being coplanar with one surface of the central portion, the semiconductor chip being mounted on a surface of the central portion that is opposite to the one surface of the central portion; and
   a sealing material that seals the semiconductor chip, the sealing material leaving the coplanar surfaces of the thin portion and the central portion of the die pad exposed, the sealing material sealing the end section of the die pad.

4. The semiconductor device according to claim 3, the thin portion and the central portion defining a step, the step having a vertical surface that extends in a direction that intersects the coplanar surfaces, the vertical surface defining a recessed portion.

5. A semiconductor device according to claim 3, further including a brazing material provided on the coplanar surface of the thin portion and the central portion of the die pad that are left exposed by the sealing material.

6. A circuit board, comprising:
   the semiconductor device according to claim 3.

7. A circuit board, comprising:
   the semiconductor device according to claim 5; and
   a heat dissipating member that is bonded to the die pad by the brazing material.

8. Electronic equipment, comprising:
   the semiconductor device according to claim 3.

9. Electronic equipment, comprising:
   the semiconductor device according to claim 5; and
   a heat dissipating member that is bonded to the die pad by the brazing material.

* * * * *